April 7, 1964 J. R. LEWIS 3,128,451

ELECTRICAL SYSTEMS

Filed Sept. 16, 1959

INVENTOR.
JOSEPH R. LEWIS
BY Nelson E. Kimmelman
ATTORNEY 3,128,451
ELECTRICAL SYSTEMS Joseph R. Lewis, Willow Grove, Pa., assignor, by mesne assignments, to Philco Corporation, Philadelphia, Pa., a corporation of Delaware Filed Sept. 16, 1959, Ser. No. 840,314
4 Claims. (Cl. 340—171)

Figure 1:
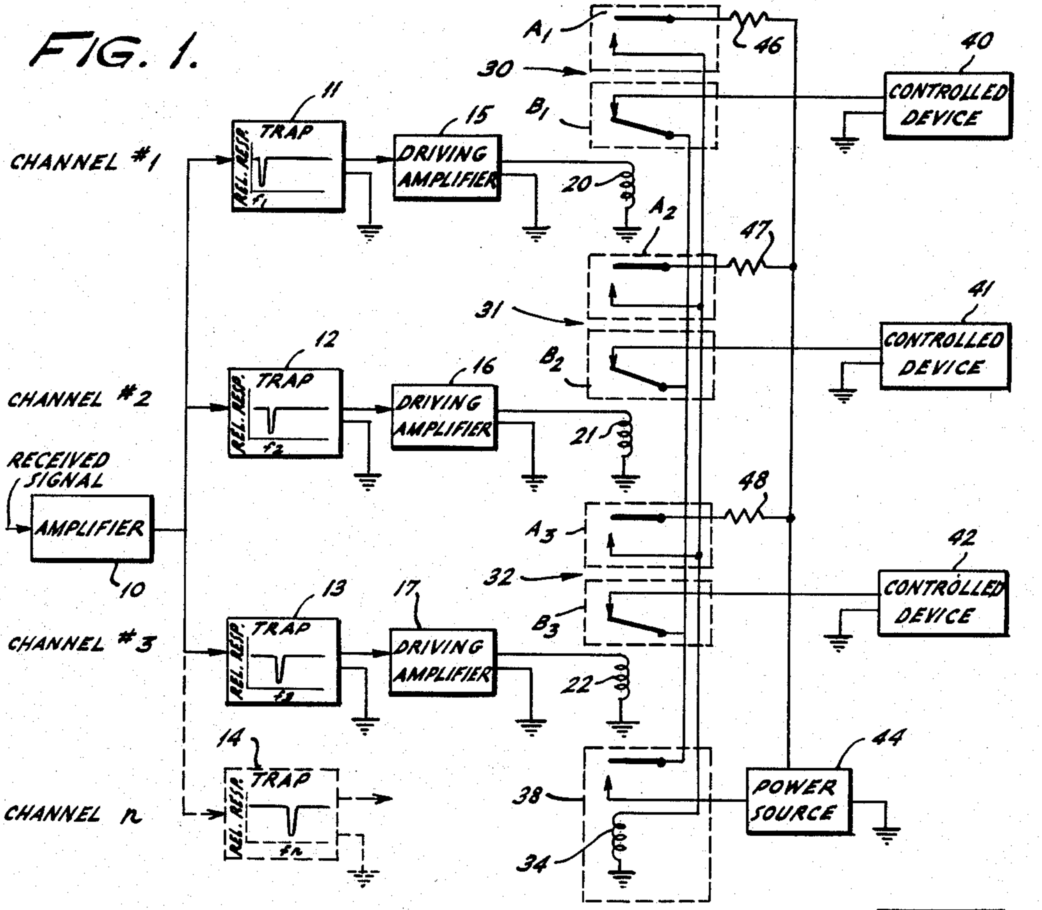

This invention relates to control equipment and in particular to circuits designed for remote control of designated apparatus.

The general field of remote control is increasing in importance especially since the advent of pilotless aircraft, missiles, rockets, and other scientific and armament applications. Even before its development for such purposes remote control was used extensively in hobbies such as control of model ships and airplanes. While the circuits and inventive concept disclosed herein may be used in any or all of the fields mentioned, as well as in allied fields, it is particularly useful in a system for the remote control of selected operations of a television home receiver.

It is usually desirable that the remote control equipment control at least several functions of the television receiver. In addition to turning the set on or off, it is desirable that the operator be able, for example, to adjust the volume of the sound, or to adjust the direction, i.e. clockwise or counter-clockwise, in which the channel tuner is rotated for tuning a particular television program. The systems hitherto employed involved electronic control of the desired functions and usually consisted of a device operated by the viewer for generating either a sonic or an electrical wave which was picked up at the receiver, and amplified by an input amplifier whose bandwidth had to be broad enough to pass all of the selected transmitted control frequencies.

The input amplifier had an output circuit coupled to the inputs of a number of tuned circuits each of which was connected to a control device for actuating a desired function. In such systems it was desired to make the selectivity of the tuned actuation circuits as high as possible so that they would reject unwanted signals and so that their sensitivity to particular ones of the transmitted control signals would be enhanced. Consequently the tuned circuits were designed to have a very high "Q" but achievement of this goal increased their cost appreciably. Furthermore, tuned circuits are not as capable, inherently, of achieving as sharp selectivity as other types of circuits as will be explained below, so that the input amplifier associated therewith had to have a broader passband than is required with other types of frequency selective circuits.

There is also another disadvantage in the use of high-Q resonant circuits, i.e., the greater the Q, the greater is the possibility that those resonant circuits will oscillate in response to a signal at their resonant frequency and thereby cause malfunction of the actuating circuit.

Accordingly, it is an object of my invention to provide a novel control circuit which is less expensive than those hitherto known.

It is a further object of my invention to provide a novel control circuit which is characterized by improved immunity to unwanted signals.

Still another object of my invention is to provide a system for a control circuit which has high noise immunity but a minimal tendency to oscillate.

Another object of the invention is to provide a control system with which an input amplifier having a relatively narrow bandwidth may be used.

In accordance with my invention I provide a control system having a number of channels containing frequency selective circuits which are coupled to respective devices to be controlled. Each channel is so constructed that when the control signal to whose frequency that channel is set is prevented from passing through that channel by the operation of the frequency selective device therein the controlled device therein is "on." Conversely, the controlled device is "off" when a control signal is applied to that channel which is not prevented from passing through by the operation of the frequency selective device therein.

More particularly, my invention comprises an input amplifier which may have a relatively narrow bandwidth and which passes signals having selected control signal frequencies, and a number of individual channels coupled to the output of the input amplifier. These channels each include a circuit, i.e., a trap, which discriminates against, and effectively rejects a predetermined one of the control signal frequencies. Coupled to each trap is a relay system (or equivalent) having two sets of contacts. The first set of contacts are connected to a controlled device and, if no signal reaches the relay, are closed. The second set of contacts are normally open and are connected by a circuit to a power source which furnishes power, via one of the first set of contacts (which is closed), to a control device only when signals arrive at the relays in all but one (i.e., $n-1$) of the channels. Thus if an incoming signal $f_1$ is amplified and applied to all channels including one which does not pass $f_1$ no signal will be applied to the relay of the latter channel and its first set of contacts will remain closed whereas its second set of contacts will remain open. However, that same incoming signal will pass through all the remaining channels and will reach the respective relays therein thereby (1) opening the first sets of contacts therein so that the controlled devices associated therewith are disconnected and (2) closing the second sets so that, since all but one of the second sets of contacts are closed, power is supplied only to the controlled device of the $f_1$ channel via the closed first set of contacts therein.

Figure 2:
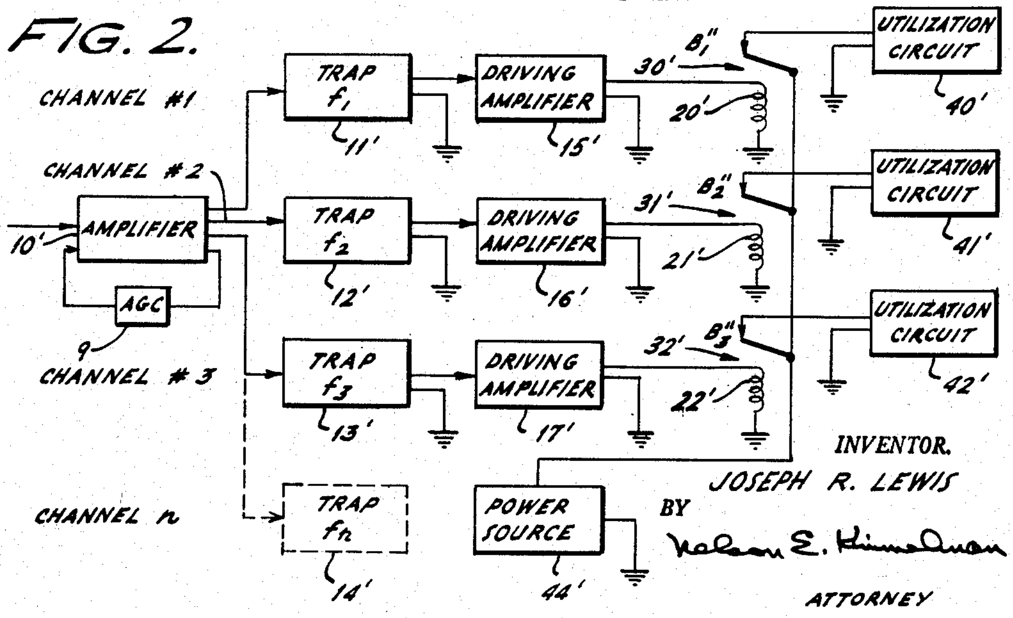

FIGURE 1 is a block and partially schematic representation of one form of my invention; and FIGURE 2 is a block and partially schematic representation of another form of my invention.

Referirng to FIG. 1 a control system is shown therein constructed in accordance with my inventive concept. The system would be located, in the case of a television receiver, at the receiver and would operate in response to received control signals generated in any of a number of ways. For example, a supersonic device which generated a supersonic wave, or, alternatively, a light-emissive device could be actuated by the viewer and the sound or light, as the case may be, could be converted into electrical signals by appropriate transducers. The viewer might also actuate a device which directly generates an electrical signal in which case no transducer would be required at the receiver.

Regardless of the method chosen, the system shown in FIG. 1 is intended to be supplied with any one of a number $f_n$ of predetermined electrical control signals designated $f_1$, $f_2$, $f_3$, et cetera. The received signal is applied to a conventional amplifier 10 which has a bandwidth sufficient to pass all control signal frequencies. The output of amplifier 10 is applied to a number $n$ of different channels, i.e., channels #1, #2, #3 . . . n. There is in each channel a signal rejection device or trap designated as 11, 12, 13, and 14 respectively. Each of these traps is constructed so as to reject substantially only a single frequency such as $f_1$, $f_2$, $f_3$, $f_n$ and to pass all others. One type of trap which has proved very effective for this purpose is the parallel-T trap as described on page 918 of "Radio Engineers Handbook" of F. E. Terman (McGraw-Hill, 1943). These traps have the advantage that it is not necessary to use inductances which, if the frequencies of the control signals used are low, are relatively expensive. Another very effective trap is the so-called "bridged-T" null trap which is also shown on page 918 of Terman and employs an inductance. With such traps very high Q's (500 or more at 40 kc.) are attainable so that the rejection is substantially only of a given single frequency.

The outputs of the traps are applied to respective driving amplifiers 15, 16, and 17. The driving amplifiers themselves are connected to the coils 20, 21, and 22 of respective relay assemblies 30, 31 and 32. Each of the latter relays has two different sets of contacts. The "A" sets, i.e., sets $A_1$, $A_2$ and $A_3$, are connected to the power source 44 via the coil 34 of a so-called "enabling relay" 38 and are open in the absence of any signal being applied to the coils 20, 21 and 22. The "B" sets of contacts $B_1$, $B_2$ and $B_3$ are in circuit with the devices 40, 41 and 42 which are to be controlled. Whenever any one of the B sets of contacts is closed and the contacts of the enabling relay 38 are also closed power is supplied through the closed B set of contacts to one of the controlled devices.

*Noise Input, No Control Signal—FIG. 1 Operation*

The operation of the apparatus shown in FIG. 1 will first be explained on the assumption that the viewer is not actuating his control box so that no control signals at all are generated. In this case the only input applied to the amplifier 10 will be noise which, it will be assumed, has a wide band of frequencies. Consequently, the noise will pass through each of the signal rejection circuits 11, 12, 13 (except, of course, for that component thereof which has the same frequency as one of the control signals). The noise that passes through the traps is applied to the driving amplifiers 15, 16 and 17 whose output currents are fed to the coils 20, 21 and 22 respectively causing all of the B sets of contacts to open and all of the A sets of contacts to close. Hence none of the controlled devices 40, 41 and 42 can receive any power from the power source 44 since all of the B sets of contacts are open. However, even if one or more of the B sets of contacts remained closed the controlled devices would nevertheless not be actuated because of the action of the enabling relay circuit. The relay 38 is operable only at one current level corresponding to closure of $n-1$ A contacts, and therefore it will operate only if the A contacts of $n-1$ relays in the channels are closed. For the $n-1$ condition current flows from the source 44 through $n-1$ of the limiting resistors 46, 47 and 48 in parallel, and thence through the coil 34 to ground. Thus, since noise causes all of the A sets of contacts of the relays of all the channels to close, the contacts in the relay 38 remain open. Consequently even if the B set of contacts of one of the channels accidentally remained closed no power would be supplied to the controlled device therein. There is, hence, double protection against actuation of any one of the control devices in the presence of noise input alone.

*One Control Signal Input—FIG. 1 Operation*

If a single control signal as, for example, $f_1$ is applied to the input of the amplifier 10 it will be amplified by the amplifier 10 and applied to all of the channels. It will pass through channels #2 and #3 inasmuch as the traps 12 and 13 are made to reject signals $f_2$ and $f_3$ respectively, and to pass all others. The signal will be amplified in the driving amplifiers 16 and 17 and will be applied to the coils of the relays 31 and 32. When the $f_1$ signal passes through the coils 21 and 22 the sets of contacts $B_2$ and $B_3$ will open so that the control devices 41 and 42 are open-circuited. Simultaneously, the presence of that signal in coils 21 and 22 will cause the sets $A_2$ and $A_3$ to close so that the resistors 47 and 48 are in parallel in the circuit with the power source 44 and the coil 34.

When the $f_1$ signal is applied to the trap 11 it is prevented from passage therethrough and hence the $A_1$ contacts of relay 30 will remain open so that the limiting resistor 46 is not in parallel with resistors 47 and 48. Under these circumstances since the A contacts of $n-1$ channels are closed and $n-1$ limiting resistors are in circuit with the power source circuit the latter will cause the contacts of the enabling relay 38 to close and power will be supplied from the source 44 through the set of closed contacts $B_1$ to the controlled device 40. Thus the controlled device of any channel will be actuated only if the signal which that channel will reject is prevented by the frequency discrimination circuit therein from reaching the relay therein. Conversely, any signal other than that signal which passes through the channel to the relay disconnects the controlled device from the circuit.

*Operation of FIG. 2 System*

FIG. 2 shows a variation of the system which obviates the need for the enabling relay 38 and simplifies the circuitry somewhat. Components which are primed in FIG. 2 are substantially the same as their unprimed counterparts in FIG. 1. It will be remarked that the system dispenses with the enabling relay, the limiting resistors, and all of the A sets of contacts. Instead an AGC loop is provided to control the gain of amplifier 10'.

In the absence of a control signal and the presence of noise the operation of the system shown in FIG. 2 is substantially the same as that of the system shown in FIG. 1. Thus when noise only is applied to the input of the amplifier 10' the output of the amplifier 10' is substantially at its maximum and the amplified noise will pass through all the channels and will energize the coils 20', 21', and 22' of the relays 30', 31', and 32'. Consequently all the sets of contacts $B_1'$, $B_2'$, and $B_3'$ will be held open preventing power from being supplied from the source 44' to any of the controlled devices 40', 41', and 42'.

When one of the control signals is applied to the system, however, the operation of the circuit changes. Assuming that the control signal has a frequency $f_1$ and is appreciably greater in amplitude than the noise, the AGC circuit 9 will respond to the increase in current through the amplifier stages by developing a negative bias which will tend to cut down the amplitude of the output signal of amplifier 10' so that the noise component thereof is substantially smaller than it was in the no-signal input condition of operation, and the output of the amplifier will consist essentially of signal frequency $f_1$ only. The signal $f_1$ will pass through the traps of channels #2 and #3 since they are constructed to reject frequencis other than $f_1$ and will be amplified in driving amplifiers 16' and 17'. The amplified signal $f_1$ then causes the coils 21' and 22' to be energized thereby causing the $B_2'$ and $B_3'$ contacts to remain in the open position (in which the noise signal had been holding them) thus keeping the controlled devices 41' and 42' decoupled from the power source 44' circuit. On the other hand the application of the signal $f_1$ to channel #1 will not cause relay 30' to remain in the open position in which the noise output had held it, since trap 11' will not pass that signal and hence there will be no amplified signal to cause the coil 20' of the relay 30' to be energized. In the latter case the contacts $B_1$ will no longer be held open and therefore the controlled device 40' will be actuated since it is now in a closed circuit with the power source 44'.

It will be seen that the systems shown in FIGS. 1 and 2 will both prevent actuation of any of the controlled devices in the event that two or more of the control signals, or stray signals at those frequencies, are applied simultaneously to the system. Thus, in FIG. 1 if signals $f_1$ and $f_2$ are simultaneously generated by inadvertence on the part of the viewer, or are picked up by chance, all of the A sets of contacts will close. This is so because $f_1$ will pass through channels #2 and #3 whereas $f_2$ will pass thru channels #1 and #3. Hence none of the controlled devices will be activated since the necessary condition of $n-1$ channel actuation is not satisfied so that the contacts on the enabling relay 38 will not close. Besides, all of the B sets will open so no power can reach any of the controlled devices in any event.

In the case of the apparatus shown in FIG. 2, if signals $f_1$ and $f_2$ are received simultaneously, the $f_2$ signal will pass through channel #1 and open the contacts of relay 30′ so that the controlled device 40′ will be disconnected from the power source 44′. Similarly, the signal $f_1$ will pass through channel #2 and cause the contacts of relay 31′ to open decoupling the controlled device 41′ from the source 44′ of power. Both of these signals will pass through channel #3 and open the relay 32′ so that the controlled device 42′ cannot operate.

While the invention has heretofore been explained in terms of a particular kind of signal rejection circuit, i.e., a high-Q T-type trap, it is to be understood that other variations are also possible within the scope of this invention so long as the controlled device of a particular channel is actuated in response to the absence, i.e., the rejection, of a desired control signal. Consequently, any conventional method of rejection, i.e., series resonant circuits connected in parallel, or parallel resonant circuits connected in series, or absorption type traps may alternatively be employed.

It is also possible to employ a single rejection circuit which is so constructed as to discriminate sharply against a number of predetermined control signal frequencies. By so doing it may be possible to avoid the necessity for a separate choke in each of the bridged-T traps that may alternatively be used.

What is claimed is:

1. A system for controlling at least three devices in response to the application thereto of a corresponding number of different frequency control signals, said system comprising: at least three channels, a common input to said channels, frequency discriminating means in the respective channels constructed to reject different ones of said control signals, whereby upon application of one of said control signals to said common input the signal is rejected in one channel and is passed through at least two other channels, at least three devices to be operated from a power source, and means controlled by said frequency discriminating means for effecting operation of only one of said devices in response to the applied signal.

2. A system for controlling a plurality of devices in response to the application thereto of a corresponding plurality of different frequency control signals, said system comprising: a plurality of channels, a common input to said channels, frequency discriminating means in the respective channels constructed to reject different ones of said control signals, whereby upon application of one of said control signals to said common input the signal is rejected in one channel and is passed through the other channels, a plurality of relays connected respectively to said channels, each of said relays having normally-closed and normally-open contacts, a plurality of controlled devices connected respectively to the normally-closed contacts of said relays, and an enabling relay having a coil connected to the normally-open contacts of said first relays and to a power source, and having normally-open contacts connected to the normally-closed contacts of said first relays and to said power source.

3. A system for controlling a plurality of devices in response to the application thereto of a corresponding plurality of different-frequency control signals, said system comprising: an amplifier to which said control signals are applied which has a passband sufficient to allow the passage of all of said control signals, a plurality of frequency discriminating means coupled to said amplifier which are constructed to reject different ones of said control signals, a plurality of relay means connected to corresponding ones of said frequency discriminating means, each of said relay means having first and second sets of contacts, said first sets of contacts being connected to corresponding ones of said devices and normally being closed, the first set of contacts of each relay means being opened whenever a signal passes the associated discriminating means, the second sets of contacts of each relay means normally being open and being closed coincidently with the opening of the first set of contacts, and an enabling relay having normally-open contacts connected to said first sets of contacts and to a source of power, said enabling relay also comprising a coil connected to said second set of contacts and to said source, said second set of contacts also being connected to said source, said enabling relay being constructed to furnish power from said source to said first sets of contacts only when all but one of said second sets of contacts are closed.

4. A system for controlling a plurality of devices in response to the application thereto of a corresponding plurality of different-frequency control signals, said system comprising: an amplifier to which said control signals are applied which has a passband sufficient to allow the passage of all of said control signals, a plurality of frequency discriminating means coupled to the output of said amplifier, each of which is constructed to reject a different predetermined control signal frequency, a plurality of amplifying means coupled respectively to the outputs of said discriminating means, a plurality of relay means all having first and second sets of contacts and coils coupled respectively to said amplifying means, said first sets of contacts normally being closed and connected to corresponding devices to be controlled, said second sets of contacts normally being open and connected to a source of power, an enabling relay having a set of contacts connected to all of said first sets of contacts and to said source of power, said enabling relay also comprising a coil connected to all of said second sets of contacts, said enabling relay being so constructed that when all but one of said second sets of contacts are closed power can be supplied from said source via the contacts of said enabling relay and via those of the first set of contacts which are closed to the controlled device associated therewith.

References Cited in the file of this patent

UNITED STATES PATENTS 2,677,014 Moynihan ______________ Apr. 27, 1954